United States Patent [19]
Angelucci et al.

[11] 4,013,209
[45] Mar. 22, 1977

[54] HIGH FORCE FLEXIBLE LEAD BONDING APPARATUS

[76] Inventors: Thomas L. Angelucci; Joseph L. Angelucci, both of P.O. Box 604, Cherryhill, N.J. 08003

[22] Filed: Mar. 24, 1976

[21] Appl. No.: 669,984

[52] U.S. Cl. .......................... 228/44.1 A; 228/6 A
[51] Int. Cl.² ........................................ H01L 21/603
[58] Field of Search ............. 228/4.5, 6 A, 44.1 A, 228/180 A; 219/85 D, 85 F

[56] References Cited
UNITED STATES PATENTS

| 3,442,432 | 5/1969 | Santangini | 228/44.1 A |
| 3,543,988 | 12/1970 | Kulicke | 228/4.5 X |
| 3,695,501 | 10/1972 | Radobenko | 228/6 A X |

*Primary Examiner*—Al Lawrence Smith
*Assistant Examiner*—K. J. Ramsey

[57] ABSTRACT

An apparatus for bonding the flexible leads of a printed circuit pattern to the terminal pads of an integrated circuit device includes means for positioning the flexible leads juxtapose the terminal pads on the semiconductor device, means for rapidly positioning a thermode opposite said juxtapose flexible leads and terminal pads, means for applying a low force to said thermode and means for subsequently applying a high force to said thermode which comprises a horizontally reciprocating and vertically actuated pivoted thermode support lever.

13 Claims, 4 Drawing Figures

HIGH FORCE FLEXIBLE LEAD BONDING APPARATUS

BACKGROUND OF THE INVENTION

1. Field of the Invention

The present invention relates to flexible lead bonding machines for semiconductor devices. More particularly, this invention relates to bonding machines for simultaneously bonding a plurality of leads to semiconductor terminal pads. The flexible lead bonding machine of the type disclosed herein employes flexible printed circuits on sprocketed tape. Such bonding machines have been referred to as gang lead bonders, innerlead bonders, outerlead bonders, and flexible lead bonders.

The present invention is directed to a high force bonding system of the type capable of causing flexible conductive leads to exceed their yield point and to form a fusion molecular bond with the terminal pads on a semiconductor device. This invention is an improvement in our Flexible Lead Bonding Apparatus application Ser. No. 588,289 filed June 19, 1975.

2. Description of the Prior Art

The trend in the manufacture of semiconductor devices is to make larger and more complex integrated circuit devices. The number of active devices per unit of area base material is being increased which aids in making the individual active devices faster and cheaper. The internal connections between components and active devices in such semiconductors are made during the process of producing the integrated circuit wafers.

The single most time consuming assembly operation in the manufacture and packaging of semiconductor devices is the wire bonding or lead attaching operation wherein conductive wires or prefabricated leads are attached to the terminals of an integrated chip and the other end of each of the wires or prefabricated leads is connected to a substrate or supporting carrier assembly.

In the aforementioned application Ser. No. 588,289 there is described a bonding machine for making a plurality of bonds simultaneously and employing eutectic solder bonds. Eutectic solder is usually formed between tin plated flexible leads and gold terminal pads or between tin alloy solder terminal pads. Such eutectic solder bonds may be formed at forces well under a hundred grams per lead, assuming a sixteen square mil bonding area and temperatures around 300° C.

Some integrated circuit manufacturers require the highest available reliability of their packaged semiconductor devices and generally conclude that gold terminal pads and gold covered conductive leads achieve this end. Bonding gold to gold requires that the compressive yield strength of the gold or gold alloy be exceeded. This is usually achieved by employing medium or high pressure to the thermode at high temperature to achieve thermocompression bonds. Such thermocompression bonds result in molecular fusion of the gold at the inner face of the bond to provide a continuous and homogenous connection. Such thermocompression bonds may be formed at forces around one hundred grams per lead, assuming a sixteen square mil bonding area and temperatures over 500° C. A forty lead semiconductor device having 16 square mil terminal bonding pads would require a total force on the thermode of about 10 pounds. Terminal pads on larger devices may exceed one hundred square mils requiring about 70 pounds of pressure at the aforementioned high temperatures.

Some integrated circuit manufacturers require the cheapest reliable conductive lead connections to their semiconductor devices. Copper leads bonded to copper terminal pads or other equivalent conductive base nonferrous metals fill this need when the leads and pads are connected by clean molecular fusion bonds. To thermocompression bond copper to copper on a 16 square mil area requires approximately 1.63 pounds per lead. A 40 lead device would require about 26 pounds of bonding force on the thermode. When outer-leads are being bonded, the area to be bonded approaches 100 square mils per lead and the thermode force necessary for bonding outerleads would be approximately 168 pounds.

When the conductive leads and terminal pads are made of high strength conductive nickel alloys, the forces necessary to make thermocompression bonds to a semiconductor device may approach 500 pounds.

Heretofore, high force thermocompression bonding systems have been made employing thermodes on the end of a hydraulic or pneumatic ram. Such devices have not been automated and are very slow. Further, such devices present problems in aligning the working face of the thermode with the conductive leads and the terminal pads to be bonded.

High pressure thermocompression bonding machines having automatic features have been made, however, such machines merely implement the mode of operation of the fluid ram mentioned above. These prior art devices mount one or more pneumatic cylinders on a moving carriage or slider and provide horizontal motion of the carriage, which supports the thermode. The thermode holder is mounted on vertical sliders on the horizontally movable carriage. After the thermode is positioned over the device to be bonded, the fluid pressure in the cylinder is increased slowly or in stages until the thermode clamps the leads between the device and the thermode. The high pressure fluid may then be applied. Retraction of the thermode to permit alignment of a new set of flexible leads with another semiconductor device is provided by reversing the motion of the cylinder, sliders, and carriage.

Prior art bonding machines were designed for a single narrow range of pressures. When prior art bonding machines were made for low pressure eutectic bonding they were not capable of making high pressure thermocompression bonds. Similarly, when prior art bonding machines were made for high pressure bonding they were not capable of providing accurate medium or low pressure forces at the thermode.

SUMMARY OF THE INVENTION

It is a primary object of the present invention to provide in a flexible lead bonding machine a high pressure bonding system capable of applying a range of forces from several grams up to and including several hundred pounds.

It is another object of the present invention to provide a flexible lead bonding machine that permits a rapid change of bonding pressures to permit bonding all types of flexible leads to all types of terminal pads.

It is yet another object of the present invention to provide a novel interchangeable thermode holder and supporting lever to permit a rapid change of bonding thermodes for bonding all types of metallurgical flexible leads to all types of semi-conductor devices.

It is another object of the present invention to provide means for rapidly removing a hot thermode and replacing it with another thermode without affecting the critical adjustments of the bonding machine.

It is another object of the present invention to provide means for adjusting the working face of the thermode into parallel adjustment with the terminal pads on a semiconductor device.

Accordingly, there is provided a flexible lead bonding apparatus having a vertically reciprocating support lever. A horizontal thermode support lever is pivotally mounted on the vertical support lever. A force lever is pivotally mounted on the fixed frame of the bonding apparatus in a position substantially parallel to and above the horizontal thermode support lever. When the thermode support lever is moved from a retracted position to a bonding position, the thermode support lever is cammed downward to position the thermode over the semiconductor device and the flexible leads to be bonded thereto. After the thermode is in a bonding position the force lever is pivoted by cam action to enable a high force operating cylinder to apply a high force to the force lever. The force arm of the force lever multiplies the force of the cylinder to provide a high force at the thermode.

DESCRIPTION OF THE PREFERRED EMBODIMENT

Figure 1:
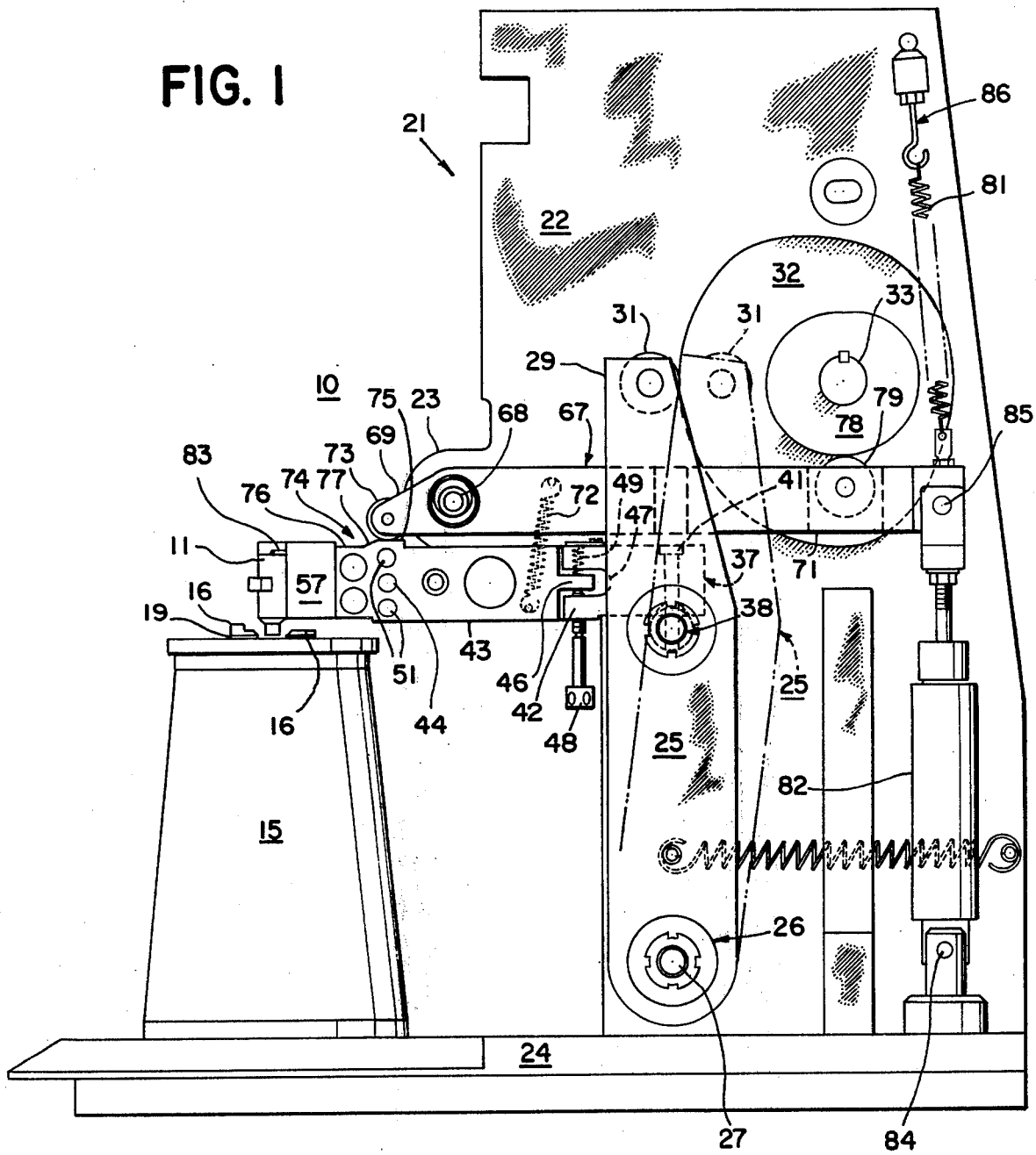
FIG. 1 is a side elevation of a preferred embodiment high force flexible lead bonding machine.
Figure 2:
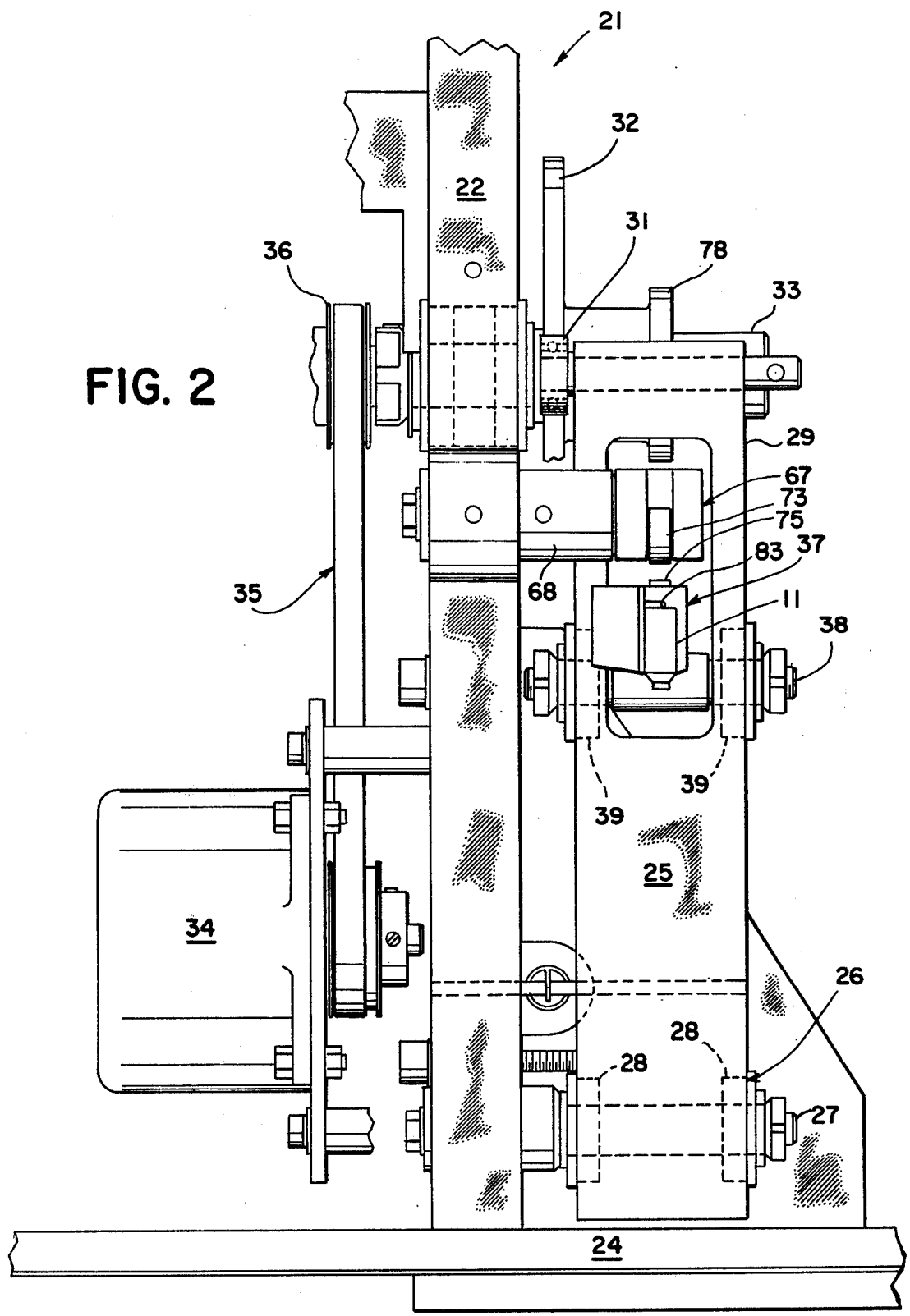
FIG. 2 is a front elevation of the preferred embodiment high force flexible lead bonding machine of FIG. 1.

Refer now to FIGS. 1 to 4 showing a flexible lead bonding machine 10. The flexible lead bonding machine 10 comprises a heated thermode(bonding tool) 11 which is adapted to compress the conductive flexible leads 12 of a flexible printed circuit into engagement with the conductive terminal pads 13 on a semiconductor device 14 and form a thermocompression bond thereto. Device 14 is shown supported by a bonding station 15 which may be an automatic or manual positioning table with or without vertical adjusting means. The inner flexible leads 12 of the printed circuit are positioned by a vacuum guide or anvil 16 and guided by exit guide 17. The foil printed circuit pattern 18 is preferably mounted on a sprocketed flexible tape 19, however, the foil printed circuit pattern 18 may be unsupported.

Rigid frame 21 comprises a massive vertical member 22 having an extension 23 thereon and includes a base 24. The extension 23 extends outward near the bonding station 15 to form a structural C-clamp therewith.

Vertical support lever 25 is pivotally mounted on frame 21 by pivot bearing 26 comprising a shaft 27 and tapered bearings 28. The upper free end 29 of lever 25 rotationally supports a cam follower 31 operably engaged with retraction cam 32. Cam 32 is mounted on a drive shaft 33 supported by frame 21 and shaft 33 is driven by a common drive motor 34 via belt 35 and pulley 36.

Horizontal support lever 37 is pivotally mounted on an axle 38 which is pivoted in bearings 39 in vertical support lever 25. A removable clamp screw 41 attaches lever 37 to axle 38.

Horizontal support lever 37 comprises a first lever 42 attached to axle 38 and a second lever 43 pivotally mounted on first lever 42. Pivot pin 44 on lever 42 extends through a double counterboard aperture 45 in lever 43 permitting both rotational movement and parallel plane adjustment of lever 43 relative to lever 42. Finger 46 of lever 43 extends into bifurcated slot 47 on lever 42. Crowned adjusting screw 48 is threaded into lever 42 and extends into bifurcated slot 47 on lever 42. Crowned adjusting screw 48 is threaded into lever 42 and engages finger 46 in slot 47. Spring 49 urges finger 46 into engagement with the crowned point of screw 48. Adjustment of screw 48 will permit front to back leveling of the working face (not shown) of thermode 11.

Lever 43 is provided with parallel adjustment relative to lever 42. Two crowned point adjusting screws 51 are threaded through lever 42 and engage the flat face of lever 43. Lever 43 is urged against ball pivot 52 providing the third point of a three point support between levers 42 and 43. Holding spring means 53 comprises a ball rod 54 engaged in and urged into counter-bore 55 by compression spring 56. Adjustment of adjusting screws 51 change the left and right side angle of the working face of the thermode 11.

The working end of lever 43 is attached to and supports thermode holder 57 which comprises a heat sink block 58 having cylindrical recesses 59 therein adapted to receive heating elements (not shown). The front face of block 58 is provided with an angular vee groove 61 adapted to receive a mating shape of the thermode body of thermode 11. Means for biasing the thermode 11 into engagment with vee groove 61 comprises clamp rod 62 which extends through heat block 58 and engages thermode 11. The front end of clamp rod 62 is provided with an apertured head 63 adapted to receive an engageable hand tool for disengaging the head 63 from a flat clamping face 64 on thermode 11.

The rear end of rod 62 comprises a clamp such as an eccentric rod 65 engaged through thermocouple block 66 and an aperture in rod 62. It will be understood that springs and/or eccentric cams mounted at the end of rod 62 would serve the same purpose. In the preferred embodiment shown, rod 62 was made of material having a lower thermal coefficient of expansion than the coefficient of the nickel alloy steel heat sink block 58.

Force lever 67 is pivotally mounted on eccentric shaft 68 which extends from member 22 of frame 21. The fixed end of shaft 68 and member 22 is eccentric to the bearing end of shaft 68 which extends into lever 67 and permits the vertical adjustment of the pivot point of shaft 68. This in turn permits the vertical elevation adjustment of thermode 11 prior to its engagement with the flexible leads 12 of thermode 11 as will be explained.

Force lever 67 comprises a force arm 69 and a lever arm 71. A spring 72 urges cam follower 73 on force arm 69 into engagement with a cam surface 74 on lever 43. When cam 32 drives lever 25 forward and lever 43 moves relative to lever 67 the cam follower 73 drives lever 43 downward vectoring thermode 11 directly to a bonding position. Cam follower 73 is shown engaging the lower thermode cam dwell surface 75 after having engaged the upper dwell cam surface 76 and the inclined cam surface 77. The reason for retracting levers 42 and 43 and thermode 11 is to permit vertical viewing and accurate alignment of the flexible leads 12 with the terminal pads 13 on the semiconductor device 14.

Figure 3:
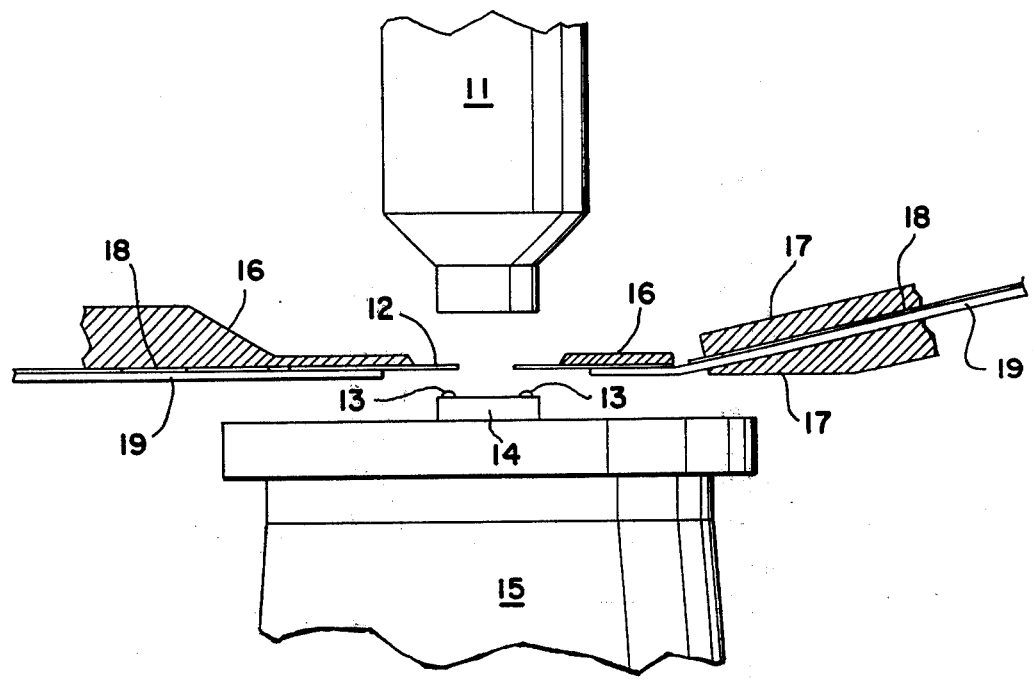
FIG. 3 is an enlarged front elevation of the preferred embodiment thermode of FIG. 1 showing a flexible printed circuit positioned by an X—Y movable tape guide opposite a semiconductor device.
Figure 4:
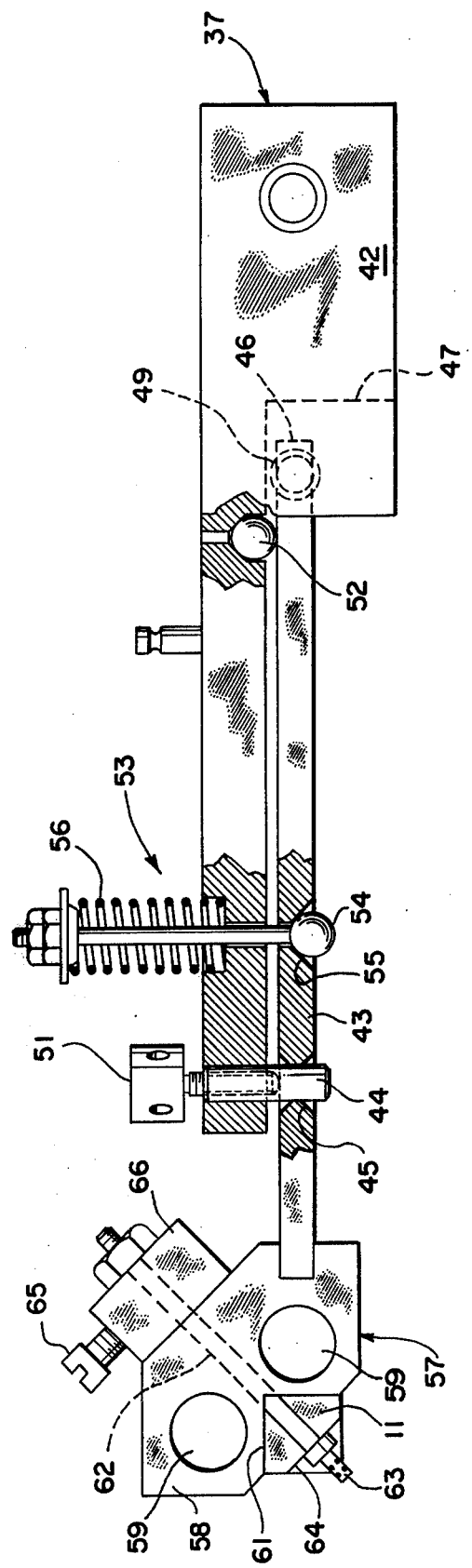
FIG. 4 is an enlarged top view of the horizontal support lever of FIG. 1.

After thermode 11 is in the bonding position shown in FIGS. 1 and 3, a cam 78 on shaft 33 permits follower 79 on arm 71 to follow programmed bonding cam 78. Lever 71 is urged into engagement with cam 78 by spring 81. Spring 81 may be a very light spring as will be explaind hereinafter. After thermode 11 engages and clamps flexible leads 12 with a light pressure to terminal pads 13, the pressure in force cylinder 82 is increased to a predetermined level to cause lever 67 to rotate and transmit a multiplied force through follower 73, lever 43, holder 57, force pin 83 and thermode 11. Force cylinder 82 is pivotally mounted on base 24 at pivot 84 and to lever arm 71 at pivot 85.

Refer now to FIG. 1 showing a feature of the present high force bonding system. When high pressure thermode bonding forces are required, a high pressure air cylinder 82 is actuated by a three-way valve (not shown) timed from shaft 33. The pressure in pounds in one inch diameter air cylinder 82 is multiplied approximately eight times at roller 73.

When the system is to be employed as a low pressure eutectic bonding system, air cylinder 82 is disabled and adjusting tension device 86 cooperating with spring 81 is set to provide the desired force on lever 71 and thermode 11.

When medium pressure bonding forces are required, both tension means 86 and a low pressure in air cylinder 82 may be employed to provide the desired bonding force at thermode 11.

It will be understood that when changing from one bonding force to another bonding force it may be necessary to change the type of thermode and bonding tool holder. Removing clamp screw 41 permits the removal of lever 42, lever 43, thermode holder 57 and the attached thermode without changing the basic settings of the machine.

It will be understood that equivalent force means to cylinder 82, springs 81 and tension means 86 may be applied to lever 71, such as counterweight systems, etc.

Having explained a preferred embodiment of the present invention it will be understood that the high pressure bonding system has a range of bonding forces from a few grams up to several hundred pounds, thus, permitting bonding all types of flexible leads to all types of semiconductor devices to form eutectic solder bonds and thermocompression bonds.

We claim:

1. A high force bonding system for a gang lead bonder comprising:
   a rigid frame,
   a bonding station for supporting a semiconductor device,
   means for positioning a flexible printed circuit juxtaposed a semiconductor device on said bonding station,
   a vertical support lever pivotally mounted on said rigid frame,
   a horizontal support lever pivotally mounted on said vertical support lever,
   a thermode holder mounted on said horizontal support lever for receiving a removably mounted thermode therein,
   a force lever pivotally mounted on said fixed frame, said force lever comprising a short force arm and a long lever arm,
   a roller follower at the end of said force arm for applying a downward force to said thermode holder,
   means for moving said horizontal support lever and said thermode holder from a retracted position to a bonding position,
   first cam means operably connected to said horizontal support lever for engaging said roller follower for depressing said thermode holder during movement from a retracted position to a bonding position, and
   high pressure force means applied at the end of said force arm for rotating said force level and operably transmitting a multiplied high pressure force through said roller follower to said thermode for bonding said flexible printed circuit to said semiconductor device.

2. A high force bonding system as set forth in claim 1 wherein said high pressure force means comprises an air cylinder and valve means for applying high pressure gas to said air cylinder when said thermode is positioned juxtaposed said flexible printed circuit and said semiconductor device.

3. A high force bonding system as set forth in claim 2 wherein said high pressure force means further comprises second cam means operably engaging said force lever intermediate said pivot and the end of said lever arm for enabling said air cylinder to move said lever arm and apply said multiplied high pressure force through said roller follower to said thermode.

4. A high force bonding system as set forth in claim 1 wherein said high pressure force means comprises a spring connected between said lever arm and said frame, and means for tensioning said spring.

5. A high force bonding system as set forth in claim 1 wherein said horizontal support lever comprises a first lever pivotally mounted on said vertical lever and a second lever mounted on said first lever for parallel plane adjustment relative thereto, whereby the working face of said thermode mounted in said thermode holder attached to said second lever is adjustable for precise parallel alignment with the bonding pads on said semiconductor device.

6. A high force bonding system as set forth in claim 5 which further includes means for adjusting the parallel plane position of said second lever relative to said first lever comprising, a ball pivot and two crown point adjusting screws forming a three point support between said first and said second levers, and holding spring means for biasing said second lever into engagement with said first lever.

7. A high force bonding system as set forth in claim 6 which further includes means for adjusting the angle of tilt of said second lever relative to said first lever comprising a crown point screw forming a pivot support for said second lever on said first lever.

8. A high force bonding system as set forth in claim 1 wherein said horizontal support lever comprises a first lever pivotally mounted on said vertical lever and a second lever pivotally mounted on said first lever for rotational movement in two axes, and said first cam means comprise a cam surface on said second lever having an inclined cam portion and a dwell cam portion, whereby movement of said thermode and said horizontal support lever from a retracted position to a bonding position engages said roller on said force lever with said inclined cam portion of said cam surface causing said thermode to diagonally approach said bonding position from a retracted position.

9. A high force bonding system as set forth in claim 1 wherein said horizontal support lever is removably attached to said vertical support at the mounting pivot.

10. A high force bonding system as set forth in claim 9 which further includes a rotatable axle pivot and a removable clamp screw connecting said horizontal support lever to said axle pivot.

11. A high force bonding system as set forth in claim 1 wherein said thermode holder on said horizontal support lever comprises a heat sink block having a vee groove for receiving a mating shape thermode, and means for biasing said thermode into engagement with said vee groove of said heat sink block.

12. A high force bonding system as set forth in claim 11 which further includes a vertical force pin mounted in said heat sink block and engagable with the top of said thermode.

13. A high force bonding system as set forth in claim 11 wherein said means for biasing said thermode into engagement with said vee groove of said heat sink block comprises a clamping shaft having a thermal coefficient of expansion less than the coefficient of expansion of said heat sink block and means for releasably locking said clamping shaft on said heat sink block.

* * * * *